United States Patent [19]

Schweitzer, Jr.

[11] Patent Number: 4,641,220
[45] Date of Patent: Feb. 3, 1987

[54] TEST POINT MOUNTED VOLTAGE MONITORING SYSTEM

[76] Inventor: Edmund O. Schweitzer, Jr., 2433 Center St., Northbrook, Ill. 60062

[21] Appl. No.: 653,492

[22] Filed: Sep. 21, 1984

[51] Int. Cl.$^4$ ............................................. G01R 19/14
[52] U.S. Cl. ................................. 361/187; 340/663; 324/133
[58] Field of Search ........................ 361/187; 324/133; 340/662, 663

[56] References Cited

U.S. PATENT DOCUMENTS

| | | | |
|---|---|---|---|
| 3,328,690 | 6/1967 | Lockie et al. | 324/122 |
| 3,524,133 | 8/1970 | Arndt | 324/133 |
| 3,524,178 | 8/1970 | Stratton | 324/133 |
| 3,577,041 | 5/1971 | Kring et al. | 361/187 |
| 4,375,617 | 3/1983 | Schweitzer, Jr. | 324/133 |
| 4,402,033 | 8/1983 | Mayer | 361/187 |
| 4,550,288 | 10/1985 | Schweitzer, Jr. | 324/133 |

Primary Examiner—L. T. Hix
Assistant Examiner—David M. Gray
Attorney, Agent, or Firm—Lockwood, Alex, FitzGibbon & Cummings

[57] ABSTRACT

A voltage monitoring system for mounting on a test point in an AC power distribution system provides an output when the voltage level on a conductor is above a predetermined minimum level. Within a sensing unit mounted on the test point a rectifier circuit develops from a capacitive coupling to the monitored conductor a voltage dependent on the voltage level of the conductor. A potentiometer applies a portion of the voltage to the gate of a MOSFET transistor, which actuates a reed-contact relay to control external switching circuitry. The potentiometer is user-adjustable from the front of the sensing unit to enable the minimum threshold level to be set.

15 Claims, 5 Drawing Figures

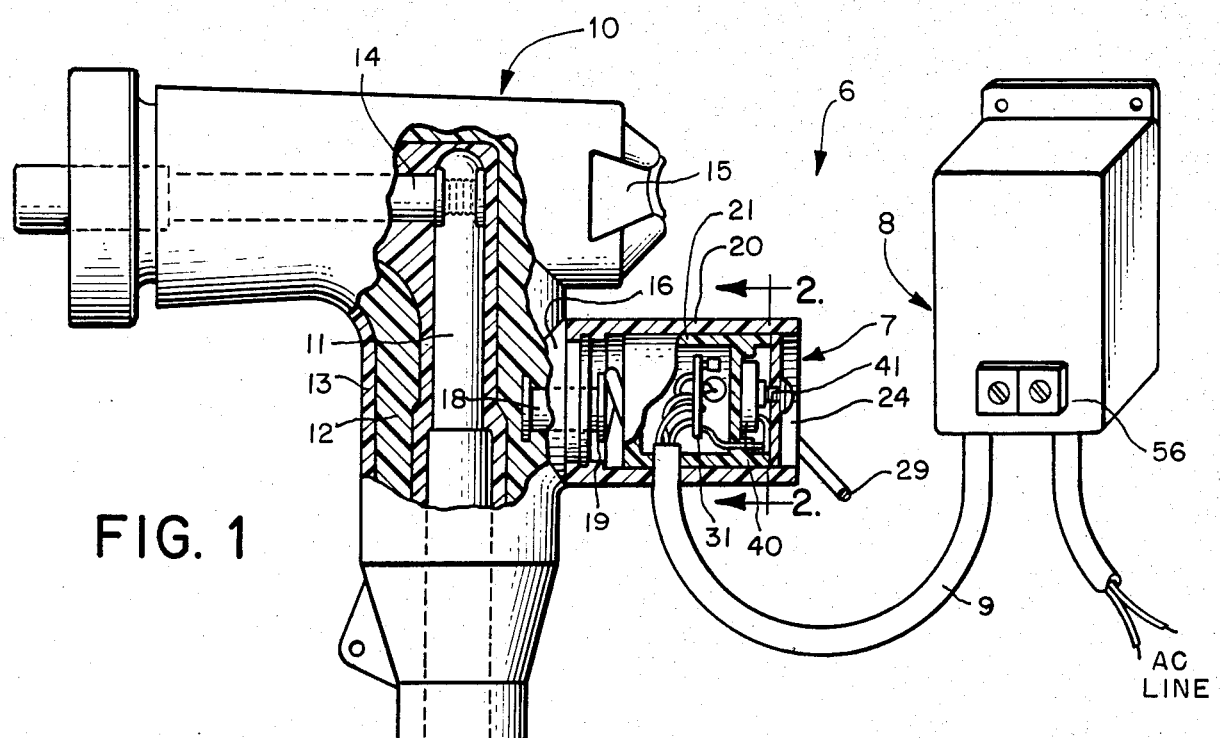
FIG. 1
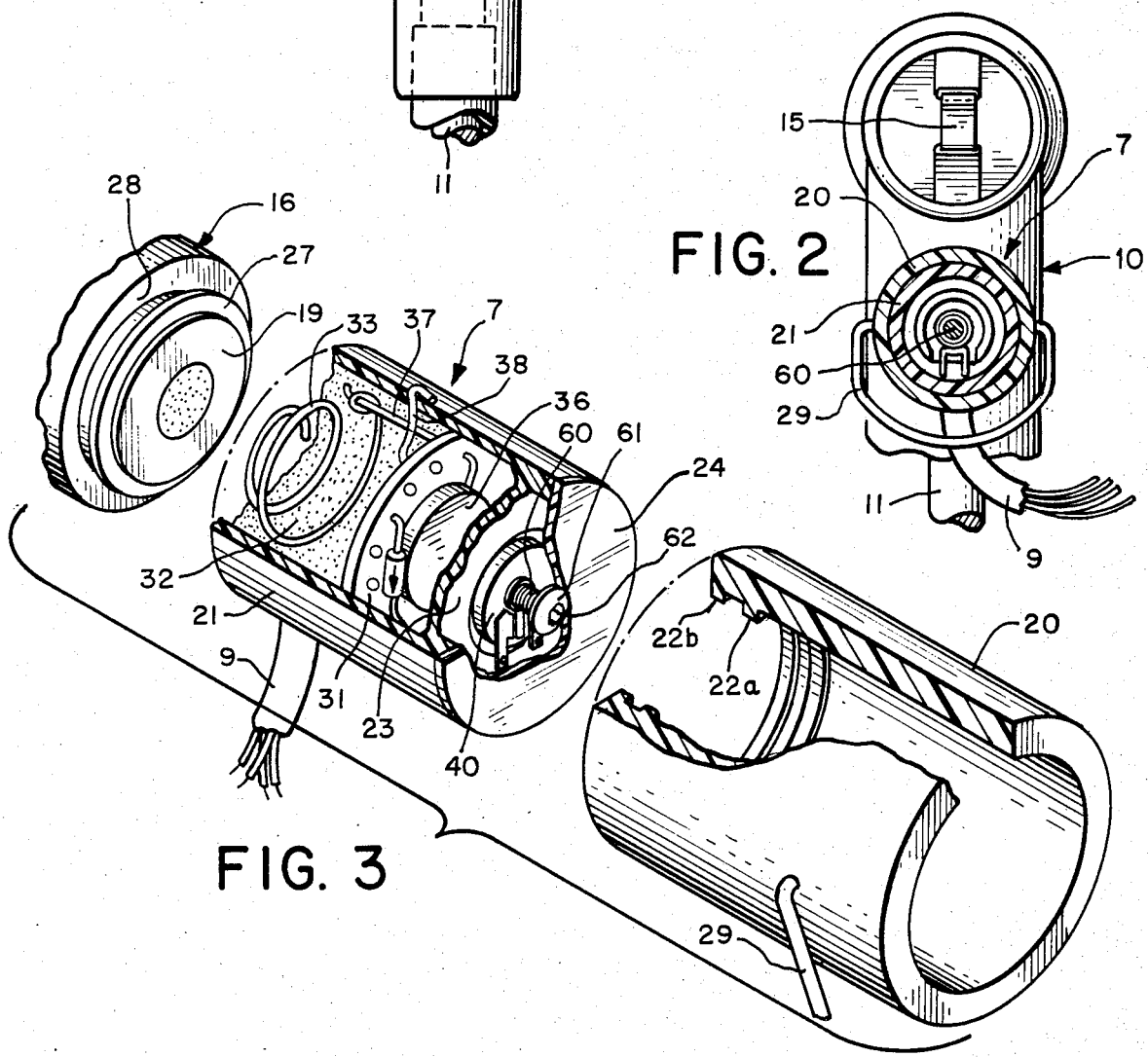
FIG. 2
FIG. 3

TEST POINT MOUNTED VOLTAGE MONITORING SYSTEM

BACKGROUND OF THE INVENTION

The present invention relates generally to voltage monitoring systems for use in high voltage alternating current power distribution systems, and more particularly, to a voltage monitoring system which mounts on a conventional test point terminal in the power distribution system to control switching functions in the system.

Frequently, in power distribution systems, it is necessary to verify the presence of an operating voltage on a circuit before that circuit is connected into the system. For example, where a load is to be transferred from an existing source to a new source, a switching control circuit prevents the transfer until the presence of voltage in the new source is confirmed. Preferably, to avoid electrical isolation problems attendant with direct connection to a high voltage circuit, verification of the voltage level in the new source is accomplished without direct connection to the monitored circuit. Furthermore, the verification is preferably made without the use of additional connecting circuitry, since this adds to the cost of the installation and precludes future circuit changes. The present invention provides a voltage monitoring system which meets these requirements by providing a system which mounts on a conventional test point of the type commonly used in power distribution systems.

Often cables used to carry alternating current at high voltage levels in power generating and distribution systems are connected to transformers and other system components by means of plug-in connectors which attach to terminals on the component. Connectors of this type often provide one or more test points for capacitively coupling test or circuit condition indicating devices, such as fault indicators, to the conductor of the connector. One such test point mounted fault indicator is described in U.S. Pat. No. 3,906,477 of to the present inventor. Various types of indicator circuits have heretofore been provided for determining whether the conductor is energized by a high voltage current. Examples of such indicator circuits are described in U.S. Pat. Nos. 3,524,178 and 3,328,690. While such indicator circuits provide a means for determining whether the conductor is energized, they do not provide for control of a related switching function.

The present invention provides a voltage monitoring system which mounts on a conventional power system test point, such as provided in an elbow connector, so as to obviate the need for direct connection to the monitored conductor. By reason of the very high impedance of the connection provided at the test point no additional insulating requirements are entailed. The voltage monitoring system utilizes only a detector unit mounted on the test point and a power supply unit connected to the detector unit by a single flexible cable. The sensing threshold of the system is easily set by means of an adjustment on the sensing unit.

Accordingly, it is a general object of the present invention to provide a voltage monitoring system which provides a control effect for controlling external switching or alarm circuitry, and which can be mounted on the test point of an electrical power distribution system.

It is a more specific object of the present invention to provide a test point mounted voltage monitoring system which is compact in construction and economical to construct.

SUMMARY OF THE INVENTION

In accordance with these and other objects of the present invention, a voltage monitoring system for installation on a test point of an electrical power distribution system is provided for providing a control effect indicative of the presence of a voltage above a predetermined minimum level on a monitored conductor of the system. The system includes rectifier means capacitively coupled to the conductor for developing a DC current having a voltage level dependent on the voltage level on the conductor, and a switching device having principal electrodes and a gate electrode. Conduction between the principal electrodes is established upon application of a current above a predetermined threshold to the gate electrode. Output circuit means coupled to the switch device provide a control effect dependent on the conduction state of the switching device. The gate electrode is coupled to the rectifier means whereby a current in excess of the predetermined threshold level is applied to the gate electrode upon the voltage level in the conductor exceeding the predetermined minimum level, causing the output circuit to produce an output indicative thereof.

The rectifier means preferably comprise a pair of diodes and a capacitor, the diodes being connected in opposite polarity to a terminal capacitively coupled to the monitored conductor, and to respective terminals of the capacitor. The switching means preferably comprise a MOSFET transistor having its gate electrode connected to the capacitor through a user-adjustable potentiometer. The output circuit preferably includes a source of unidirectional current and a relay, the relay having a coil connected in series with the source and the principal electrodes of the MOSFET transistor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a side elevational view, partially in section, of a voltage monitoring system constructed in accordance with the invention, showing the system installed on the test point of a conventional elbow connector.

FIG. 2 is a cross sectional view of the sensing unit of the voltage monitoring system taken along line 2—2 of FIG. 1.

FIG. 3 is an enlarged perspective view, partially broken away and partially in section, showing the principal components of the sensing unit.

DESCRIPTION OF THE PREFERRED EMBODIMENT

Figure 4:
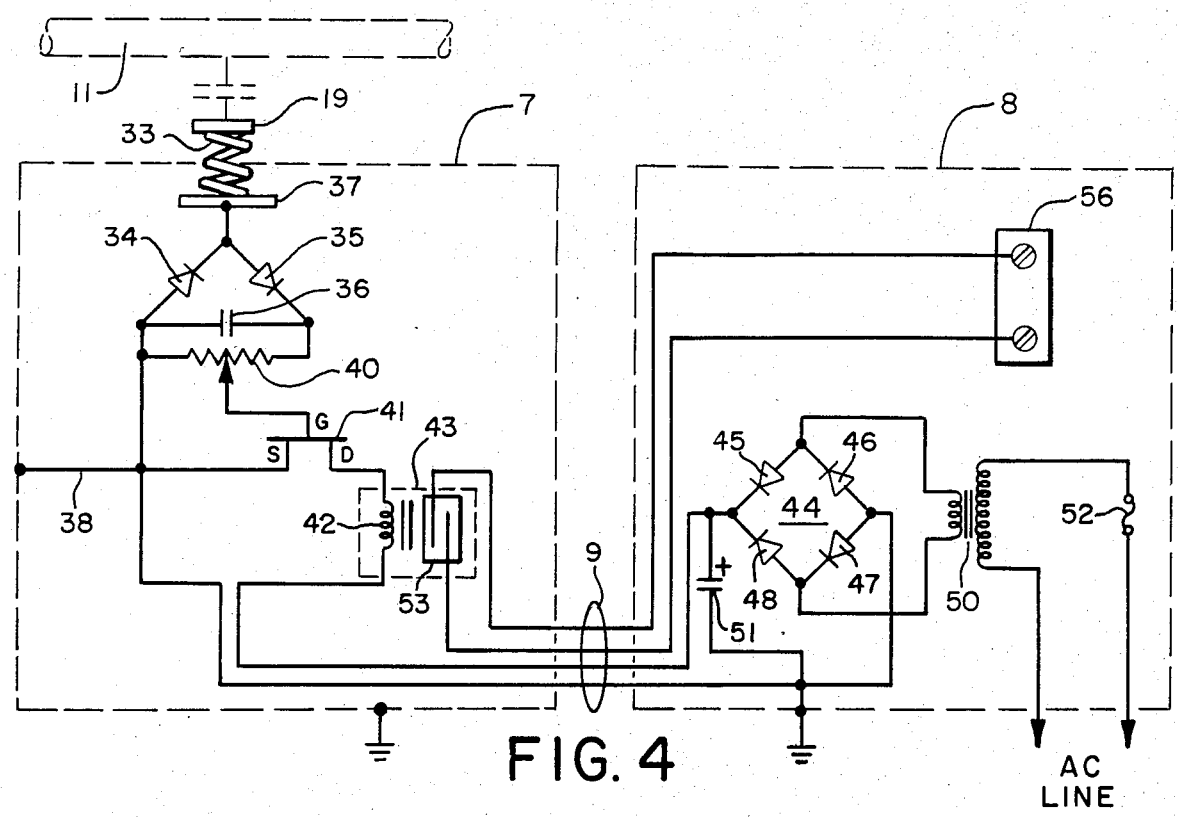
FIG. 4 is a schematic diagram of the voltage monitoring system of FIG. 1.

Referring to the drawings, and particularly to FIG. 1, a voltage monitoring system 6 having a sensing unit 7, a power supply unit 8, and an interconnecting cable 9, is shown in conjunction with a conventional elbow connector 10. As shown, the connector 10 includes generally an axial conductor 11 extending through an electrically insulating body portion 12 encased in an electrically-conductive sheath 13, the sheath being grounded in accordance with conventional practice. An electrically-conductive contact member 14, threaded at one end into an aperture in the end of conductor 11, extends from conductor 11 to mate with a complementary contact on the component (not shown) to which the connector is attached. An arcuate member 15 having ends anchored in the accordance sheath 13 extends from the connector to receive the hooked end of a lineman's tool to facilitate installation and removal of the connector from the component.

With reference also to FIGS. 2 and 3, elbow connector 10 includes a test point 16 for receiving a circuit condition indicating device, in this case the sensing unit 7 of voltage monitoring system 6. The test point is formed by a portion of the insulating body portion 2 which projects radially through the conductive sheath 13. Included in the test point is an electrically conductive contact 18 having an annular outer flange portion 19, which is exposed at the outer end of the terminal to provide an electrical connection to the contact, and an inner portion in proximity to conductor 11 to capacitively couple circuitry in detection unit 7 of system 6 to conductor 11.

The housing of sensing unit 7 comprises an electrically conductive semi-flexible rubber outer shell 20 which is open at one end for mounting to test point 16. The shell 20 encloses a cylindrical housing 21 in which the electrical components of sensor unit 7 are contained. Housing 21 is held in position by an annular flange 22a on the inside surface of shell 20. A second annular flange 22b secures the shell over the test point. The cylindrical housing 21 includes an integral partition 23 which serves as a mask and spacing element, and an end cap 24 which is sonically welded to the end of the housing.

When sensor unit 7 is installed on test point 16, the annular end flange 22b of shell 20 snaps over an annular exterior rib 27 of the test point to secure the shell in position. At the same time, the outer surface of the shell engages a lip 28 of the connector sheath 13 adjacent the base of the test point to make electrical contact therewith and ground the shell. At the closed end of shell 20, a wire handle 29 may be provided to facilitate removal of detector unit 7 from connector 10 with a conventional hooked lineman's tool.

As shown in FIG. 3, a disc-shaped insulator board 31 is positioned perpendicular to the axis of housing 21 in a location intermediate the ends thereof. The insulator board is secured in position by an epoxy material 32 filling the open of the housing. The insulator board 31 serves as a mounting means for the electrical components of the voltage sensor unit. When the sensing unit is mounted on the test point as shown a spring contact 33, which is electrically and mechanically connected to circuit board 31, serves to establish electrical contact with test point contact 19.

Referring to FIG. 4, spring contact 33 is electrically connected to rectifier means in the form of a pair of diodes 34 and 35 and a capacitor 36. Diode 35 is connected between a terminal 37 at the base of the spring contact and one terminal of the capacitor. Diode 34 is connected in reverse polarity to diode 35 between terminal 37 and the other terminal of the capacitor. The juncture of diodes 34 and 35, which comprises a first input terminal of the rectifier means, is electrically connected to the test point contact 19 by helical spring contact 33. At one end, the spring contact is connected, such as by soldering, to a wire conductor 37 extending within housing 21 from the juncture of diodes 34 and 35 through a perforation in circuit board 31. When the voltage sensing unit 7 is installed on the test point terminal, the other end of the spring contact is resiliently pressed against the exposed annular flange 19 of contact 18 to effect a connection between the test point contact and the sensing unit. The other terminal of the capacitor is also connected to ground by means of a conductor 38 which extends through housing 21 into contact with the electrically conductive shell 20.

The juncture of diode 34 and capacitor 36, which comprises the other input terminal of the rectifier circuit, is grounded by a wire conductor 38. In particular, the conductor 38 extends through a perforation in wiring board 31, where it is soldered to the rectifier circuit components, and through an aperture 41 in the wall of the cylindrical housing 21. There, the end of the wire conductor is compressively wedged between housing 21 and shell 20 such that the connection to ground is completed through the electrically conductive shell and the connector sheath 13.

When conductor 11 in the connector is energized by a high voltage alternating current, a corresponding alternating current is capacitively induced in the test point contact 18. This induced current is coupled through spring contact 33 and conductor 37 to the rectifier circuit means which, in turn, rectify the induced current to charge capacitor 36. The voltage developed across capacitor 36 is proportional to the voltage level of conductor 11.

To establish a user-adjustable threshold for the voltage monitoring system, a potentiometer 40 is connected across capacitor 36. The arm of this potentiometer is connected to the gate electrode of a MOSFET transistor switch device 41. With this arrangement, a portion of the voltage developed across capacitor 36 determined by the setting of potentiometer 40 is applied to the gate electrode. To provide a control effect indicative of the conduction state of transistor 41 the drain electrode of the device is connected to the winding 42 of a reed-contact relay 43. The remaining terminal of winding 42 is connected through cable 9 to a source of unidirectional current in the form of a bridge-type rectifier 44 comprising four diodes 45–48.

The juncture of diodes 45 and 46, which comprises an input terminal of the bridge rectifier circuit, is connected to one terminal of the secondary winding of a transformer 50. The juncture of diodes 47 and 48, which comprises the other input terminal of the network, is connected to the remaining secondary terminal of the transformer. The juncture of diodes 45 and 48, which comprises the positive polarity output terminal of the rectifier network, is connected to winding 42 and to a storage battery 51, which may be a conventional lead-acid gel-type battery. The juncture of diodes 46 and 47, which comprises the other output terminal of the rectifier network, is connected to ground.

Power is supplied to transformer 50 from the AC line through a fuse 52. To provide contact closures suitable for controlling the function of an external device, such as a transfer relay, the reed contacts 53 of relay 42 are connected to a terminal strip 56 accessible from the exterior of the power supply unit housing. Alternately, the contacts can be connected to control a secondary relay. This relay may be contained within the power supply unit 8 and may include normally open and normally-closed contacts of conventional construction which may be connected to respective terminals on terminal board 56. A directional current for operating the auxiliary relay may be provided by bridge rectifier 44.

In operation, the portion of the voltage developed across capacitor 36 selected by potentiometer 40 is applied to the gate electrode of MOSFET transistor 41. When the applied voltage exceeds the threshold level of the transistor, conduction is established between the principal source and drain electrodes of the device, causing relay 43 to be energized by current developed by rectifier network 44. The closure of contacts 53 of relay 44 results in a control effect at terminals 54 useful in controlling external circuitry.

The actual voltage level on conductor 11 at which transistor 41 becomes conductive, and hence at which a control effect is provided, is determined by the setting of potentiometer 40. Referring to FIG. 3, this potentiometer, in accordance with one aspect of the invention, is mounted on the divider 23 within housing 21 such that its control shaft 60 extends through the end cover 24 of the housing, making the potentiometer readily adjustable when the sensing unit 7 is mounted on the test point. To this end, the control shaft may include an exposed head portion 61 containing a hex-shaped recess 62 for receiving a hex wrench or similar adjusting device (not shown). Alternatively, a conventional screw driver slot can be provided in the exposed head to facilitate adjustment. Appropriate indicia can be provided on the exterior end surface 24 of housing 21 to indicate the relative position of the potentiometer control shaft, if desired.

The capacitance coupling between the test point contact 19 and conductor 11 is in practice less than 5 picofarads, making relatively little energy available for operation of the monitoring circuit, while providing a high degree of electrical isolation. For this reason, the switching transistor 41 is provided as a MOSFET device, which has a high input impedance and requires only a very low current at its gate electrode to initiate conduction. The current required for operation of relay 43 is provided by the externally powered bridge rectifier 44.

Consequently, the small amount of energy derived at the test point is utilized to control the MOSFET switching device 41, while the substantially greater power required for operating relay 43 is provided by rectifier network 44. By reason of transformer 50, complete isolation is maintained between the circuit powering unidirectional current source or rectifier network 44 and the current of the monitored conductor 11.

Figure 5:
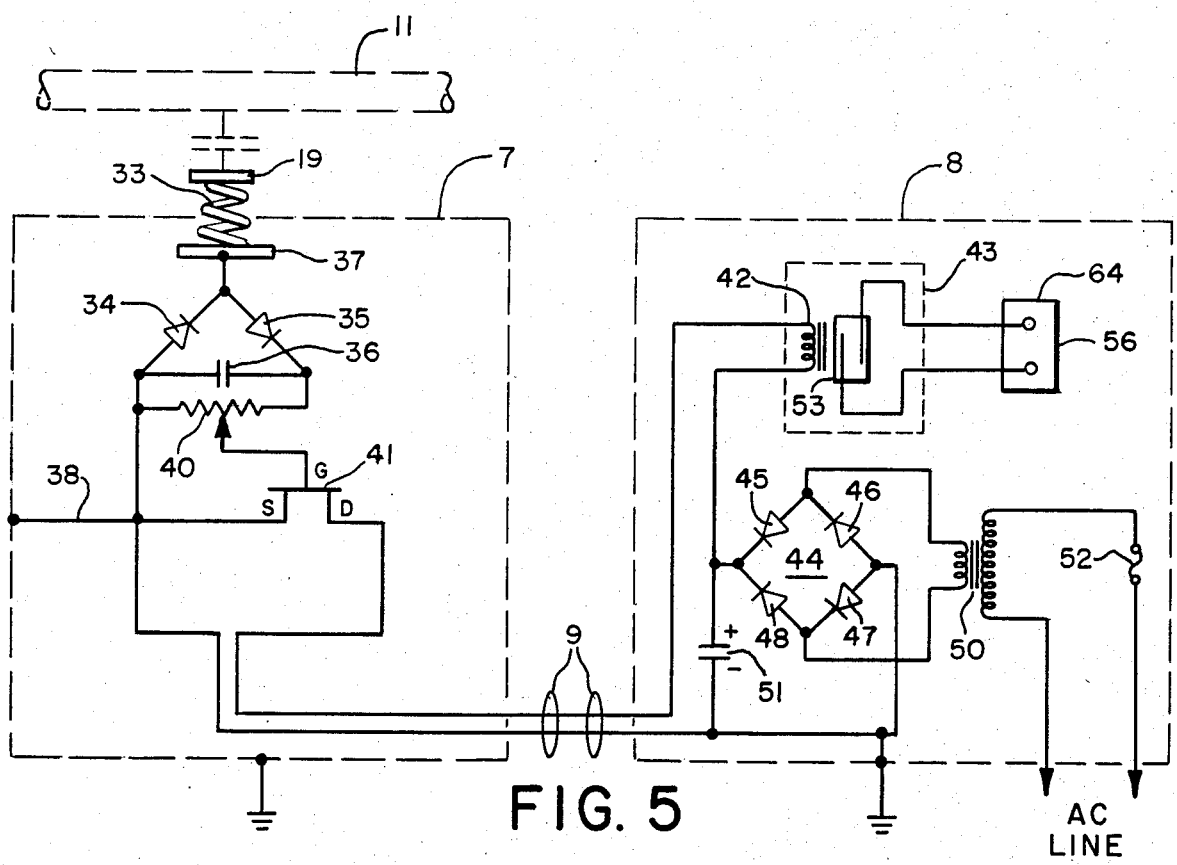
FIG. 5 is a schematic diagram similar to FIG. 4 showing an alternate construction of the system.

Referring to FIG. 5, in some applications it may be desirable to locate relay 43 within the power supply unit 8. This reduces the number of conductors required in the interconnecting cable 9. Where no secondary relay is provided, the read contacts 53 of relay 43 are connected directly to terminal block 56 for connection to an external circuit. The circuit of FIG. 5 is otherwise identical in operation to that of FIG. 4.

In one successful commercial embodiment of the invention for use in conjunction with electrical power distribution circuits operating within a range of 2.5-34 kilovolts, and having a 12 VDC power supply, the following components were utilized:

Diodes 34-35—Type 1N4007
Capacitor 36-0.2 microfarad Mylar
Potentiometer 40-3.0 Megohms linear taper
Transistor 41—MOSFET Type IRF511
Winding 42-3000 turns No. 37 wire
Diodes 45-48—Type 1N4007

It will be appreciated that the sensing unit 7 and the power supply unit 8 can be separated as required in a particular installation, the length of the interconnecting cable 9 being varied accordingly. In practice, the power supply unit 8 will be mounted at a remote location near the source of AC line current relied on for providing operating power.

The voltage monitoring system of the invention, when installed on a power distribution system test point, provides a very compact and economical means of ascertaining the presence or absence of a desired voltage level on a monitored conductor. The system may be readily adjusted while in place to sense a particular threshold voltage level by means of a readily accessible screw driver adjustment. The system requires few components and is extremely compact and easy to install. Use of the system obviates the need for potential transformers and similar devices previously used in voltage monitoring applications.

While the voltage monitoring system has been shown in conjunction with a switching control application, it will be appreciated that other applications are possible, such as providing an alarm in the event of over-voltage or under-voltage situations.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A voltage monitoring system for providing an output indicative of the voltage level of a monitored high voltage conductor in an alternating current power distribution system falling below a predetermined minimum level, comprising:

a capacitor;

rectifier circuit means for capacitively coupling said capacitor to the conductor whereby said rectifier means develop a direct current sensing voltage on said capacitor dependent on the alternating current voltage level on the conductor;

a switching device having principal electrodes and a control electrode, conduction between said principal electrodes being established upon the application of a sensing voltage above a predetermined threshold level to said control electrode;

coupling circuit means for applying a predetermined portion of said sensing voltage to said control electrode whereby said predetermined threshold level is exceeded and conduction occurs between said principal electrodes upon the voltage level in the monitored conductor exceeding the predetermined minimum level; and output circuit means including the principal electrodes of said switch device for providing a control effect indicative of the voltage falling below the predetermined minimum level.

2. A voltage monitoring system as defined in claim 1 wherein said rectifier means comprise a pair of diodes, a capacitor, and a terminal capacitively coupled to the conductor, said first diode being connected between said capacitively coupled terminal and one terminal of said capacitor, said second diode being connected between said capacitively coupled terminal and the other terminal of said capacitor, and being poled oppositely at said terminal relative to said first diode.

3. A voltage monitoring system as defined in claim 1 wherein said coupling circuit means comprise a potentiometer connected across said capacitor, the sensing voltage level applied to said control electrode being dependent on the setting of said potentiometer.

4. A voltage monitoring system as defined in claim 3 wherein said potentiometer is user-adjustable.

5. A voltage monitoring system as defined in claim 1 wherein said switch device comprises a transistor.

6. A voltage monitoring system as defined in claim 5 wherein said transistor comprises a MOSFET transistor.

7. A voltage monitoring system as defined in claim 1 wherein said output circuit means include a source of unidirectional current and a control relay having a winding connected in series with said unidirectional current source and said principal electrodes of said switch device.

8. A voltage monitoring device as defined in claim 7 wherein the contacts of said control relay provide said control effect.

9. A voltage monitoring system as defined in claim 7 wherein said switch device comprises a MOSFET transistor.

10. A test point mounted voltage monitoring system for providing a control effect upon the voltage level of a monitored high voltage conductor in an alternating current power distribution system falling below a predetermined minimum level, comprising:
    a housing arranged for mounting on said test point;
    contact means within said housing for engaging the contact of the test point;
    a capacitor;
    rectifier circuit means for connecting said contact to said capacitor to develop a direct current sensing voltage on said capacitor dependent on the alternating current voltage level on the conductor;
    a switching device having principal electrodes and a control electrode, conduction between said principal electrodes being established upon the application of a sensing voltage above a predetermined threshold level to said control electrode;
    coupling circuit means for applying a predetermined portion of said sensing voltage to said control electrode whereby said predetermined threshold level is exceeded and conduction occurs between said principal electrodes upon the voltage level in the monitored conductor exceeding the predetermined minimum level; and
    output circuit means including the prinicipal electrodes of said switch device for providing a control effect indicative of the voltage falling below the predetermined minimum level.

11. A test point mounted voltage monitoring system as defined in claim 10 wherein said switch device comprises a transistor.

12. A test point mounted voltage monitoring system as defined in claim 11 wherein said transistor comprises a MOSFET transistor.

13. A test point mounted voltage monitoring system as defined in claim 10 wherein said output circuit includes a source of unidirectional current and a control relay having a winding connected in series with said unidirectional current source and the principal electrodes of said switch device.

14. A test point mounted voltage monitoring system as defined in claim 13 wherein said relay is contained within said housing.

15. A test point mounted voltage monitoring system as defined in claim 10 wherein said system includes an auxiliary housing containing said unidirectional current source, and said relay is contained within said auxiliary housing.

* * * * *